(12) United States Patent
Zeng et al.

(10) Patent No.: US 8,757,971 B2
(45) Date of Patent: Jun. 24, 2014

(54) FAN MOUNTING ASSEMBLY

(75) Inventors: Biao Zeng, Shenzhen (CN); Xiang Zhang, Shenzhen (CN); Zhi-Guo Zhang, Shenzhen (CN); Li-Fu Xu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 470 days.

(21) Appl. No.: 13/095,866

(22) Filed: Apr. 28, 2011

(65) Prior Publication Data

US 2012/0087790 A1    Apr. 12, 2012

(30) Foreign Application Priority Data

Oct. 12, 2010    (CN) .......................... 2010 1 0503049

(51) Int. Cl.
*F01D 25/28* (2006.01)
(52) U.S. Cl.
USPC ...................................................... 415/213.1
(58) Field of Classification Search
USPC .................... 415/213.1, 214.1, 220
See application file for complete search history.

(56) References Cited

U.S. PATENT DOCUMENTS

| 6,193,478 | B1 * | 2/2001 | Lin et al. .................. 417/423.15 |
| 6,215,659 | B1 * | 4/2001 | Chen .............................. 361/695 |
| 6,547,516 | B2 * | 4/2003 | Liu ................................ 415/108 |
| 6,556,437 | B1 * | 4/2003 | Hardin ..................... 361/679.48 |
| 7,281,893 | B2 * | 10/2007 | Pan .............................. 415/177 |
| 7,758,304 | B2 * | 7/2010 | Pan .............................. 415/177 |
| 7,862,297 | B2 * | 1/2011 | Mizuguchi ................. 415/213.1 |
| 8,322,974 | B2 * | 12/2012 | Chen ............................ 415/119 |
| 8,356,976 | B2 * | 1/2013 | Zhang et al. .............. 415/213.1 |
| 8,371,805 | B2 * | 2/2013 | Peng et al. .................... 415/119 |

* cited by examiner

*Primary Examiner* — Nathaniel Wiehe
*Assistant Examiner* — Brian O Peters
(74) *Attorney, Agent, or Firm* — Novak Druce Connolly Bove + Quigg LLP

(57) ABSTRACT

A fan mounting assembly includes a mounting tray and a fan. The mounting tray includes a base plate and at least one mating block protruding from the base plate. The fan includes a housing and a blade accommodated in the housing. The blade is configured to blow air from a first side of the fan to a second side of the fan. The fan having a mating surface located at the second side and mated with the at least one mating block.

16 Claims, 4 Drawing Sheets

FAN MOUNTING ASSEMBLY

BACKGROUND

1. Technical Field

The present disclosure relates to a fan mounting assembly that prevents incorrect installation of a fan.

2. Description of Related Art

Computers usually include a chassis and one or more fans installed in the chassis for dissipating heat in the chassis. The fan includes a housing attached to the chassis and a blade pivotably mounted in a circular opening of the housing. The blade draws and pushes air through the circular opening in an axial direction. The fan should be installed in the chassis and blows air to a desired direction. However, the fan is symmetrical and lends itself to being installed backwards.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
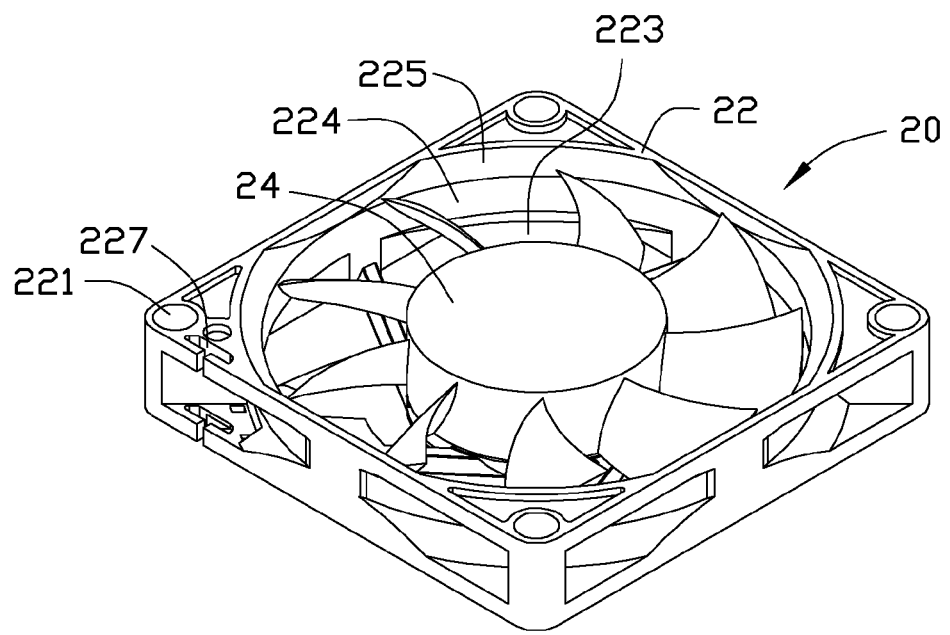
FIG. 1 is an exploded view of a fan mounting assembly according to an embodiment.
Figure 1:
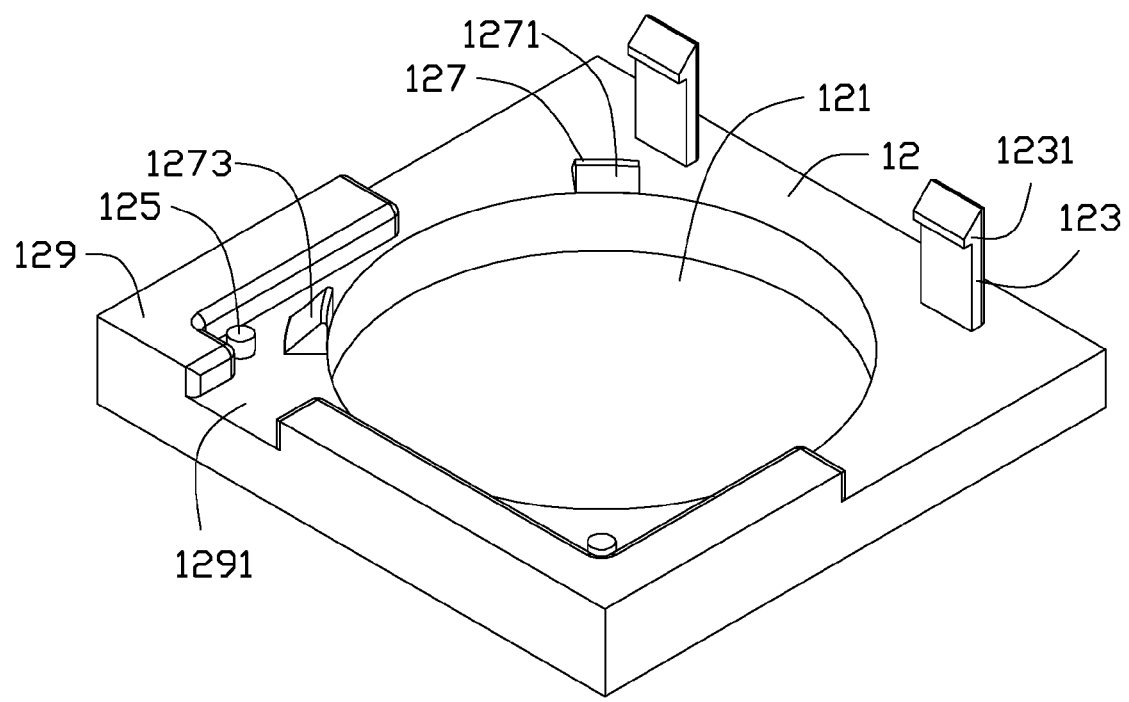
Figure 2:
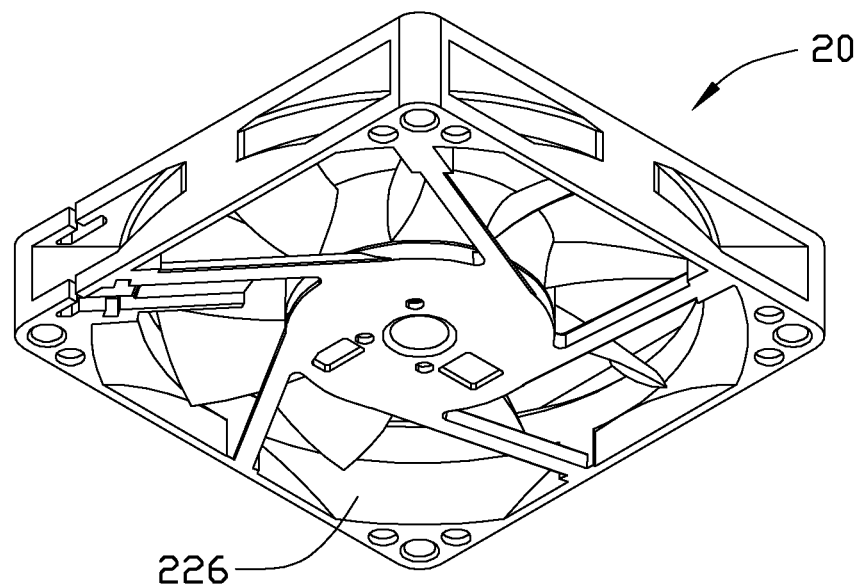
FIG. 2 is similar to FIG. 1, but viewed from another aspect.
Figure 2:
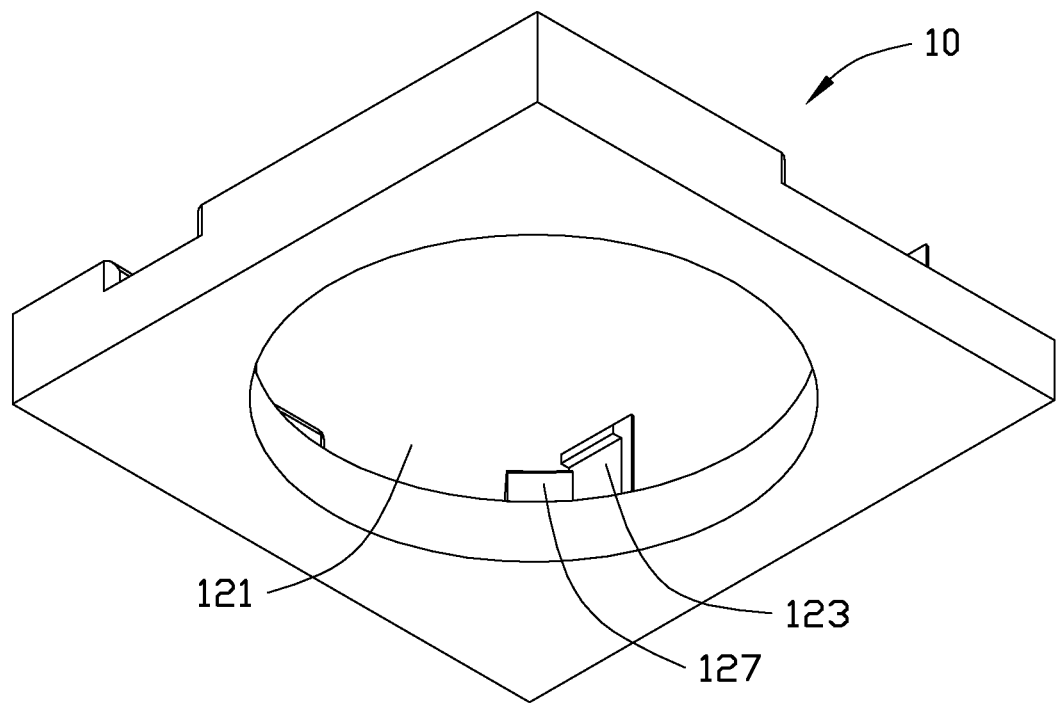

Referring to FIGS. 1 and 2, an embodiment of a fan mounting assembly includes a mounting tray 10 and a fan 20.

The mounting tray 10 includes a base plate 12. A circular hole 121 is defined in the base plate 12. A pair of resilient pieces 123 extends perpendicularly and upward from the base plate 12. A hook portion 1231 protrudes from an upper end of each of the pair of resilient pieces 123. A pair of mounting posts 125 extends perpendicularly and upward from the base plate 12. The pair of resilient pieces 123 is adjacent to a first side of the base plate 12. The pair of mounting posts 125 is adjacent to a second side of the base plate 12 opposite to the first side. A pair of mating blocks 127 extends upward from the base plate 12 and is located adjacent to an edge of the circular hole 121. Each of the pair of mating blocks 127 is wedge shaped and includes a vertical surface 1271 perpendicular to the base plate 12 and a guiding surface 1273 positioned at an oblique angle relative to the vertical surface 1271. Two holding protrusions 129 protrude from two corners at the first side of the base plate 12. Each of the holding protrusions 129 is L shaped. A gap 1291 is defined between the two holding protrusions 129.

The fan 20 includes a housing 22 and a blade 24 enclosed by the housing 22. A mounting hole 221 is defined in each of four corners of the housing 22. The housing 22 has a rectangular outer shape. A circular mounting opening 223 is defined in a central portion of the housing 22. The blade 24 is pivotably mounted in the circular mounting opening 223. The housing 22 includes a circular interior surface 224 enclosing the circular mounting opening 223, a first slanting surface 225, and a second slanting surface 226 with a fool-proof function. The first slanting surface 225 is connected to an upper edge of the circular interior surface 224 and is located at an air inlet of the fan 20. The second slanting surface 226 is connected to a lower edge of the circular interior surface 224 and is located at an air outlet of the fan 20. An oblique angle of the first slanting surface 225 is different from that of the second slanting surface 226. The oblique angle of the second slanting surface 226 is equal to that of the guiding surface 1273. Thus, the mating blocks 127 can match the second slanting surface 226. A diameter of the circular interior surface 224 is greater than a diameter of the blade 24. A cable receiving slot 227 is defined in the housing 22 for receiving cables of the fan 20.

Figure 3:
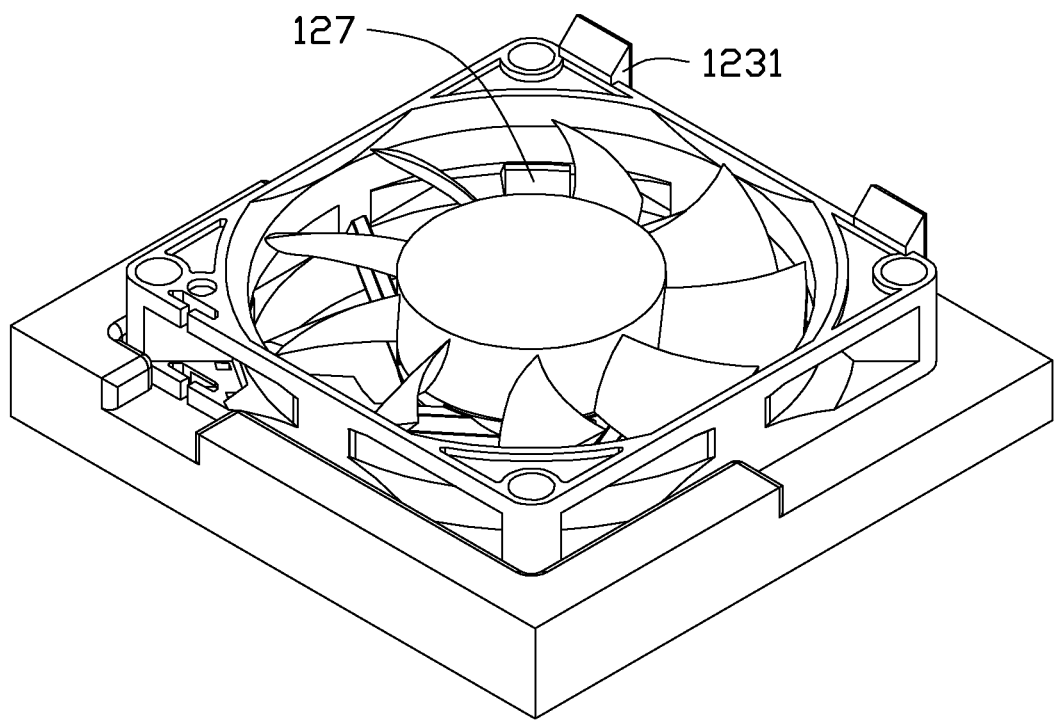
FIG. 3 is an assembled view of the fan mounting assembly of FIG. 1.
Figure 4:
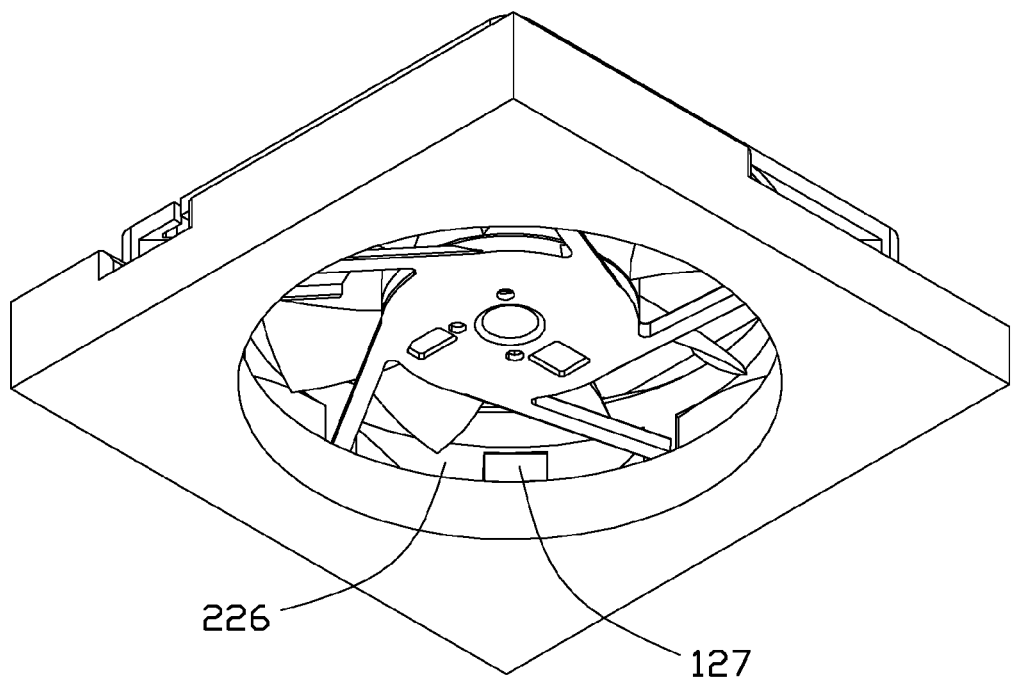
FIG. 4 is an assembled view of the fan mounting assembly of FIG. 2.

Referring to FIGS. 3 and 4, in assembly, the cable receiving slot 227 is aligned with the gap 1291. The second slanting surface 226 faces the mating blocks 127. The pair of mounting posts 125 is engaged in two mounting holes 221 located at the same side as the cable receiving slot 227. The second slanting surface 226 abuts against the guiding surfaces 1273 of the pair of mating blocks 127. Each of the pair of resilient pieces 123 is deformed outwards until the fan 20 slides across the hook portion 1231. Then the hook portion 1231 is releasably engaged with the fan 20 to prevent upward movement of the fan 20. The blade 24 faces the circular hole 121 for blowing out airflow through the circular hole 121.

The fan 20 can be only attached to the mounting tray 10 at a single desired position where the cable receiving slot 227 is aligned with the gap 1291 and the second slanting surface 226 engages with the guiding surfaces 1273 of the mating blocks 127. Thus, the fan mounting assembly of the present disclosure has a foolproof function to prevent the fan 20 being attached to the mounting tray 10 in an incorrect position. In alternative embodiments, other fool-proof structures can be used to perform the foolproof function.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A fan mounting assembly comprising:
    a mounting tray comprising a base plate and at least one mating block protruding from the base plate;
    the at least one mating block comprising a vertical surface perpendicular to the base plate and a guiding surface connected to the vertical surface; the guiding surface having an inclined angle relative to the vertical surface; and
    a fan comprising a housing and a blade accommodated in the housing, the blade configured to blow air from a first side of the fan to a second side of the fan, the fan having a mating surface located at the second side and mated with the at least one mating block; and the inclined angle of the guiding surface being the same as the inclined angle of the mating surface.

2. The fan mounting assembly of claim 1, wherein a mounting opening is defined in the housing for accommodating the blade, and a circular hole is defined in the base plate and aligned with the mounting opening.

3. The fan mounting assembly of claim 2, wherein at least one mounting hole is defined in the housing, and the mounting tray comprises at least one mounting post protruded from the base plate and engaged in the at least one mounting hole.

4. The fan mounting assembly of claim 3, wherein the mounting tray further comprises at least one resilient piece extending upward from the base plate and a hook portion protruding from a distal end of the at least one resilient piece, and the hook portion is releasably engaged with the housing.

5. The fan mounting assembly of claim 4, wherein the mounting tray further comprises two holding protrusions protruding from two corners of the base plate, and a gap is defined between the two holding protrusions.

6. The fan mounting assembly of claim 5, wherein a cable receiving slot is defined in the housing and aligned with the gap.

7. The fan mounting assembly of claim 2, wherein the housing comprises a circular interior surface surrounding the mounting opening.

8. The fan mounting assembly of claim 7, wherein the housing further comprises a slanting surface connected to the circular interior surface at the first side, the mating surface is connected to the circular interior surface at the second side, and an inclined angle of the slanting surface is different from that of the mating surface.

9. A fan mounting assembly comprising:
a mounting tray comprising a base plate and at least one mating block protruding from the base plate;
the at least one mating block comprising a vertical surface perpendicular to the base plate and a guiding surface connected to the vertical surface; the guiding surface having an inclined angle relative to the vertical surface; and
a fan, attached to the mounting tray, comprising a housing and a blade accommodated in the housing;
the fan having an inlet and an outlet located at opposite sides thereof, and a mating surface located at the same side as the inlet or the outlet to mate with the at least one mating block; the inclined angle of the guiding surface being the same as the inclined angle of the mating surface, and the blade configured to blow air from the inlet to the outlet.

10. The fan mounting assembly of claim 9, wherein a mounting opening is defined in the housing for accommodating the blade, and a circular hole is defined in the base plate and aligned with the mounting opening.

11. The fan mounting assembly of claim 10, wherein at least one mounting hole is defined in the housing, and the mounting tray comprises at least one mounting post protruded from the base plate and engaged in the at least one mounting hole.

12. The fan mounting assembly of claim 11, wherein the mounting tray further comprises at least one resilient piece extending upward from the base plate and a hook portion protruding from a distal end of the at least one resilient piece, and the hook portion is releasably engaged with the housing.

13. The fan mounting assembly of claim 12, wherein the mounting tray further comprises two holding protrusions protruding from two corners of the base plate, and a gap is defined between the two holding protrusions.

14. The fan mounting assembly of claim 13, wherein a cable receiving slot is defined in the housing and aligned with the gap.

15. The fan mounting assembly of claim 10, wherein the housing comprises a circular interior surface surrounding the mounting opening.

16. The fan mounting assembly of claim 15, wherein the housing further comprises a slanting surface connected to the circular interior surface, the circular interior surface is located between the slanting surface and the mating surface, and an inclined angle of the slanting surface is different from that of the mating surface.

* * * * *